United States Patent
Katsube et al.

(10) Patent No.: US 8,805,314 B2
(45) Date of Patent: Aug. 12, 2014

(54) FILTER CIRCUIT AND RECEIVING DEVICE

(71) Applicant: Renesas Electronics Corporation, Kawasaki (JP)

(72) Inventors: Yasuku Katsube, Chiyoda-ku (JP); Takeshi Uchitomi, Chiyoda-ku (JP); Yutaka Igarashi, Chiyoda-ku (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/651,910

(22) Filed: Oct. 15, 2012

(65) Prior Publication Data

US 2013/0095779 A1 Apr. 18, 2013

(30) Foreign Application Priority Data

Oct. 14, 2011 (JP) ................................. 2011-226462

(51) Int. Cl.
*H04B 7/00* (2006.01)

(52) U.S. Cl.
USPC ........ 455/232.1; 455/213; 455/280; 455/286; 455/306; 327/558; 327/552

(58) Field of Classification Search
CPC ................................ H04B 1/30; H03G 3/3052
USPC ...................... 455/232.1, 213, 280, 286, 306; 327/558, 552; 307/520
See application file for complete search history.

(56) References Cited

U.S. PATENT DOCUMENTS

| | | | |
|---|---|---|---|
| 5,051,628 A * | 9/1991 | Hanna | 327/553 |
| 6,762,644 B1 | 7/2004 | Sutardja | |
| 7,123,082 B2 * | 10/2006 | Kurose et al. | 327/552 |
| 7,592,864 B2 * | 9/2009 | Kang et al. | 327/558 |
| 2004/0218576 A1 | 11/2004 | Imagawa et al. | |

FOREIGN PATENT DOCUMENTS

| | | |
|---|---|---|
| JP | 2003-46401 A | 2/2003 |
| JP | 2007-202147 A | 8/2007 |
| JP | 2009-147526 A | 7/2009 |

* cited by examiner

*Primary Examiner* — Sanh Phu
(74) *Attorney, Agent, or Firm* — Sughrue Mion, PLLC

(57) ABSTRACT

To implement a filter circuit with low noise and a low cutoff frequency in a smaller area, a filter circuit has a first circuit which receives an input signal supplied to an input terminal, amplifies the signal, and outputs the amplified signal to an output terminal, a first differential amplification circuit for receiving the output signal of the first circuit through a first capacitance element, a first resistance element for forming a negative feedback path between the input and output of the first differential amplification circuit, and a second resistance element for forming a negative feedback path between the output of the first differential amplification circuit and the input of the first circuit.

20 Claims, 9 Drawing Sheets

| MODE | GSM | WCDMA | LTE |
|---|---|---|---|
| fc | 135KHz | 1.92MHz | 10MHz |
| C1 | 21pF | 21pF | 4pF |
| SW_1~SW_4 | CLOSE | OPEN | OPEN | under the following terms:

FILTER CIRCUIT AND RECEIVING DEVICE

CROSS-REFERENCE TO RELATED APPLICATIONS

The disclosure of Japanese Patent Application No. 2011-226462 filed on Oct. 14, 2011 including the specification, drawings and abstract is incorporated herein by reference in its entirety.

BACKGROUND

The present invention relates to a filter circuit and a receiving device including the filter circuit, and particularly to a technique effectively applied to a filter circuit requiring filter characteristics of a lower cutoff frequency.

The market of wireless mobile communication including cellular phones is expected to shift from voice services to multimedia services which simultaneously provide video, voice, and data for supporting advanced interactive applications in the future. This requires high-speed communication systems for enabling faster wireless packet data access. For example, wireless mobile communication systems are shifting from the second generation typified by GSM (Global System for Mobile Communications) to the third generation typified by WCDMA (Wideband Code Division Multiple Access) as a wider-band communication system and further to the fourth generation-compatible LTE (Long Term Evolution). The third-generation downstream speed has increased to a maximum of 2 Mbps in WCDMA for example. Further, LTE can support a downstream speed of 300 Mbps or more in theory.

Thus, a number of communication systems coexist; accordingly, multimode cellular phone terminals for supporting multiple communication systems are required in the market, and the cost reduction becomes important. The receiving system of low IF (Intermediate Frequency) and direct conversion in a wireless unit of a cellular phone enables the configuration to be simplified by the proper use of circuit design and integration technology in comparison with a heterodyne system etc., and is therefore an effective system solution to reduce the cost of the wireless receiving unit of the multimode cellular phone terminal.

In the receiving system of low IF and direct conversion, it is necessary to have a low-pass filter (LPF) in a baseband after frequency conversion to suppress interfering signals outside a reception band. Patent Documents 1 to 4 disclose related arts of the filter circuit.

U.S. Pat. No. 7,592,864 B2 (Patent Document 1) discloses a filter circuit using a high-pass filter and a capacitance amplifier. The capacitance value of a small capacitance element is amplified by the capacitance amplifier, thereby reducing the area of the filter circuit. The amplification of the capacitance value is implemented by amplifying a voltage applied across the capacitance. In-band noise is filtered by the capacitance, thus bringing about a configuration with little noise degradation.

Japanese Unexamined Patent Publication No. 2009-147526 (Patent Document 2) discloses a complex band-pass filter circuit (BPF) using the phase rotation of two low-pass filters. Specifically, the filter circuit in Patent Document 2 operates as a complex band-pass filter as a whole by feeding back the output of one low-pass filter to the input of the other low-pass filter having a phase difference of 90 degrees. The connection between the two low-pass filters is switched by a switch, so that a band to be limited can be switched between a Low-IF band and a Zero-IF band.

Japanese Unexamined Patent Publication No. 2003-46401 (Patent Document 3) discloses a filter circuit for implementing the characteristics of a band-pass filter by combining a low-pass filter and a high-pass filter (HPF) as a channel selection filter unit for selecting a self-channel signal by band-limiting I and Q signals.

Japanese Unexamined Patent Publication No. 2007-202147 (Patent Document 4) discloses an integrating circuit using a transimpedance amplifier (TIA) for implementing wideband amplification as a whole by negatively feeding back outputs to inputs in a plurality of nested series-coupled transimpedance amplifiers.

SUMMARY

In general, the cutoff frequency of a filter circuit comprised of a resistance R and a capacitance C is inversely proportional to the product of R and C. Further, since the resistance R generates thermal noise, the noise voltage of the filter circuit using the capacitance C and the resistance R is proportional to the resistance R. Therefore, to lower the noise of the filter circuit, it is desirable to increase the capacitance instead of the resistance. That is, the implementation of a filter circuit with low noise and a low cutoff frequency requires a large capacitance C, compared to the implementation of a filter circuit with a high cutoff frequency. However, when the capacitance is formed over a semiconductor substrate (chip), since a capacitance value is proportional to an element area and a large area is needed compared to the resistance, the implementation of the filter circuit with low noise and a low cutoff frequency requires a larger chip area. For example, in a filter circuit for narrow-band signals such as GSM applied to a direct conversion receiver, a large-area capacitance is needed to implement the filter characteristics of low noise and a low cutoff frequency.

On the other hand, according to the filter circuit described in Patent Document 1, the capacitance value of the small capacitance element is amplified by the capacitance amplifier, thereby reducing the area of the filter circuit. FIG. 12 shows the circuit configuration of the filter circuit described in Patent Document 1. In the filter circuit 500 shown in FIG. 12, a capacitance amplifier 310 is provided subsequent to an operational amplifier OP10, and the output of the capacitance amplifier 310 is negatively fed back to the input of the operational amplifier OP10 through capacitances C9, C10. This enables the capacitance values of the capacitances C9, C10 to be apparently amplified by the amplification factor of the capacitance amplifier 310.

In the configuration of the capacitance amplifier 310, an operational amplifier OP315 and an RC time constant filter 311 are used, but a so-called differentiating circuit is not used. From another point of view, if a resistance R11 is infinite (such usage is not described in Patent Document 1, and only the setting of the resistance R11 to a realistic resistance value seems to be taken into consideration), the configuration can be assumed to be a differentiating circuit comprised of an input capacitance C11, the operational amplifier OP315, and a feedback resistance R13. However, even with such an assumption, in the configuration of Patent Document 1, the output signal of the capacitance amplifier 310 is negatively fed back to the input of an imperfect integrating circuit through the capacitances C9, C10, but is not negatively fed back through resistances.

Assuming that elements configuring the differential circuit have the same values, the amplification factor Hc(s) of the capacitance amplifier 310 is expressed by the following equation (1).

$$H_C(s) = \frac{R_{13}}{R_{11}} + sR_{13}C_{11} \qquad (1)$$

To obtain the amplified capacitance value of the capacitances C9, C10 at the cutoff frequency of the whole filter circuit, the amplification factor Hc(s) shown in equation (1) needs to be 1 or more. That is, in the case of decreasing the capacitances C9, C10 to reduce the area of the filter circuit, it is necessary to increase the amplification factor in proportion to the decrease rate. Accordingly, as shown in FIG. 12, R11 and C11 are coupled in parallel in the filter circuit 500, which can increase the amplification factor from a low frequency.

Here, the operation of the filter circuit 500 will be reviewed. First, consideration will be given to a case where the contribution rate of the second term of equation (1) to the amplification factor Hc(s) is small. For example, in a reception band, if the contribution rate of the second term of equation (1) is small, it is necessary to increase the value of (R13/R11) to amplify the capacitance value of the capacitances C9, C10. However, if (R13/R11) is increased to amplify the capacitances, signals in the reception band outputted from the operational amplifier OP10 are also amplified; accordingly, the output signal of the capacitance amplifier 310 might be distorted, depending on the output capability (maximum output voltage) of the operational amplifiers OP10 and OP315. Next, consideration will be given to a case where the contribution rate of the second term of equation (1) to the amplification factor Hc(s) is large. If R11 is infinite, it is necessary to lower the cutoff frequency of the capacitance amplifier 310 and increase the high-frequency amplification factor. This leads to the amplification of the in-band signal, which might distort the output of the capacitance amplifier 310 and degrade the in-band signal. However, if the amplification factor is decreased, the capacitances C9, C10 cannot be decreased, which does not lead to the reduction in the area of the filter circuit.

Thus, according to the filter circuit shown in Patent Document 1, if (R13/R11) is increased to increase the amplification factor of the capacitance amplifier 310 to decrease the capacitances C9, C10, there is a problem of increasing signal distortion. That is, although the capacitance C9 is originally provided to reduce the area, if the gain of the operational amplifier OP315 is decreased to operate the filter with good linearity, the capacitance C9 has to be increased in the end, so that there is a problem that it is difficult to ensure compatibility between linearity improvement and area reduction. Further, the present inventors have studied and found that if the filter circuit 500 in Patent Document 1 is applied to a multimode receiving device for supporting narrow-band to wideband communication systems such as GSM to LTE, interference filtering characteristics might deteriorate in the wideband communication mode due to the influence of the frequency characteristics of the capacitance amplifier 310.

Further, the filter circuit described in Patent Document 2 is the complex band-pass filter circuit using the phase rotation of two low-pass filters as described above but not a low-pass filter, and does not bring about area reduction focusing on capacitance size and noise in the complex band-pass filter. The filter circuit described in Patent Document 3 is the filter circuit for implementing the characteristics of the band-pass filter by series-coupling the low-pass filter and the high-pass filter, but does not feed back the output of the high-pass filter, and does not bring about area reduction focusing on capacitance size and noise in the high-pass filter and the low-pass filter. Further, in the integrating circuit described in Patent Document 4, parasitic noise and power loss increase with an increase in the number of nested transimpedance amplifiers, which reduces circuit efficiency. That is, the technique described in Patent Document 4 does not bring about a low-noise and small-area filter circuit.

It is an object of the present invention to implement a filter circuit with low noise and a low cutoff frequency in a smaller area.

The above and other objects and novel features of the present invention will become apparent from the description of this specification and the accompanying drawings.

A typical aspect of the invention disclosed in the present application will be briefly described as follows.

The present filter circuit has a first circuit which amplifies a signal and outputs the amplified signal to an output terminal, a first differential amplification circuit for receiving the output signal of the first circuit through a first capacitance element, a first resistance element for forming a negative feedback path between the input and output of the first differential amplification circuit, and a second resistance element for forming a negative feedback path between the output of the first differential amplification circuit and the input of the first circuit.

An effect obtained by the typical aspect of the invention disclosed in the present application will be briefly described as follows.

According to the present filter circuit, it is possible to implement a filter circuit with low noise and a low cutoff frequency in a smaller area.

DETAILED DESCRIPTION

1. Outline of Embodiments

Figure 1:
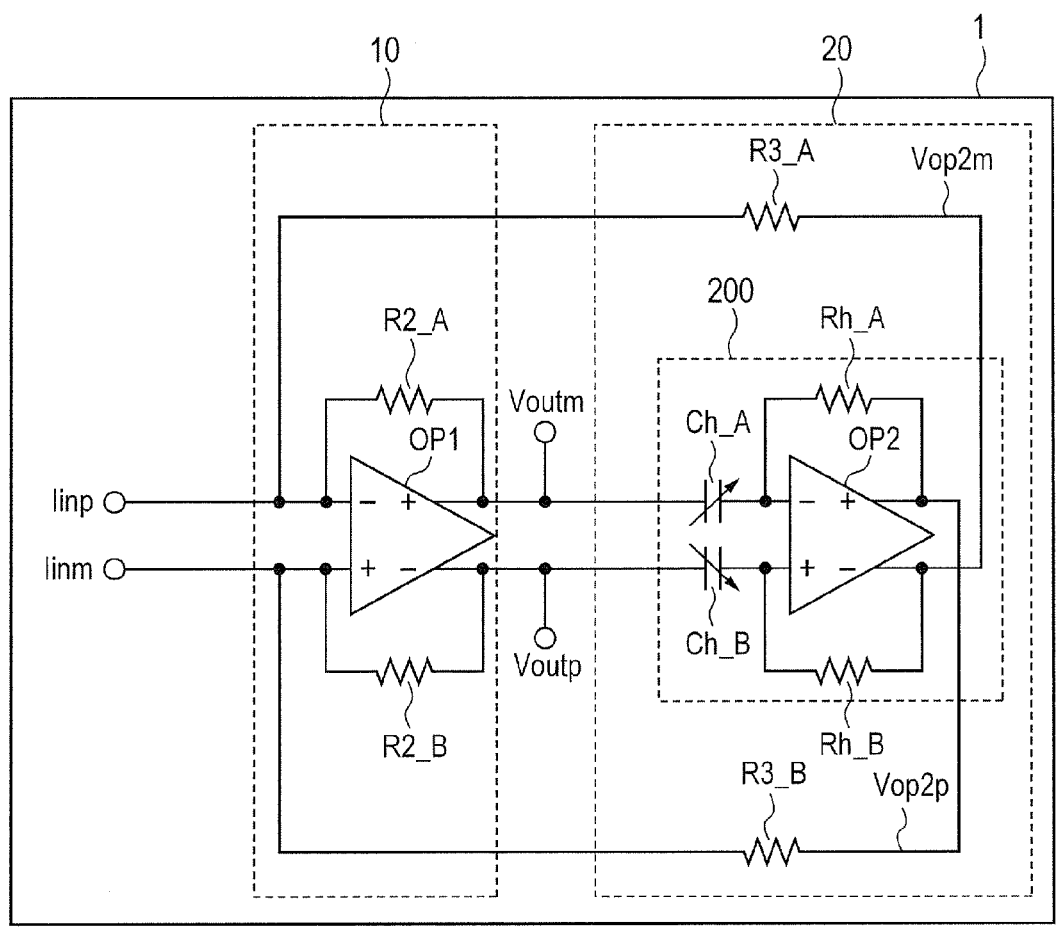
FIG. 1 is a block diagram showing an example of a filter circuit according to a first embodiment.

First, exemplary embodiments of the invention disclosed in the present application will be outlined. Reference numerals in the drawings that refer to with parentheses applied thereto in the outline description of the exemplary embodiments are merely illustration of ones contained in the concepts of components marked with the reference numerals.

[1] Low-Pass Filter Comprised of Amplifier, Differentiating Circuit, and Negative Feedback Resistance R3

A filter circuit (1-5) according to an exemplary embodiment of the invention has a first circuit (10, 11) which receives a signal supplied to an input terminal (Iinp, Iinm (Vinp, Vinm)), amplifies an input signal (which is the signal supplied to the input terminal), and outputs an amplified signal to an output terminal (Voutm, Voutp), and a second circuit (20, 21, 22) which receives the signal outputted to the output terminal and is feedback-coupled to the input of the first circuit. The second circuit (20, 21, 22) has a first capacitance element (Ch_A, Ch_B), a first differential amplification circuit (OP2) for receiving the signal outputted to the output terminal through the first capacitance element, a first resistance element (Rh_A, Rh_B) for forming a negative feedback path between the input and output of the first differential amplification circuit, and a second resistance element (R3_A, R3_B) for forming a negative feedback path between the output of the first differential amplification circuit and the input of the first circuit.

The filter circuit according to item 1 operates as a low-pass filter as a whole by negatively feeding back the output of a differentiating circuit (high-pass filter) comprised of the first resistance element, the first capacitance element, and the first differential amplification circuit to the first circuit. The cutoff frequency of the filter circuit as a low-pass filter is determined based on the product of the capacitance value of the first capacitance element and the resistance value of the first resistance element configuring the differentiating circuit, and decreases as the product increases. Therefore, in the case of lowering the cutoff frequency, the resistance value of the first resistance element is increased. According to this, when the filter circuit is formed over a semiconductor substrate, it is possible to suppress an increase in the area of the first capacitance element and reduce the area of the filter circuit. Although the increase in the resistance value of the first resistance element increases the thermal noise of the resistance, the second circuit operates as a high-pass filter and therefore can suppress noise generated in a frequency band lower than the cutoff frequency. That is, even if the first resistance element is increased to reduce the area of the first capacitance element, it is possible to suppress an increase in noise.

[2] First Circuit: TIA

In the filter circuit according to item 1, the first circuit has a second differential amplification circuit (OP1) for receiving the signal supplied to the input terminal and a signal fed back through the second resistance element and a third resistance element (R2_A, R2_B) for forming a negative feedback path between the input and output of the second differential amplification circuit.

According to the filter circuit of item 2, whether or not signal distortion occurs in the second circuit is determined according to the ratio between the maximum output voltage of the first differential amplification circuit and the maximum output voltage of the second differential amplification circuit and the ratio between the resistance value of the second resistance element and the resistance value of the third resistance element, and is independent of the magnitude of the resistance value of the first resistance element. Therefore, even if the resistance value of the first resistance element is increased to obtain filter characteristics of a low cutoff frequency, signal distortion in the second circuit does not increase, so that it is possible to implement a filter circuit with low distortion.

[3] Operational Amplifier Configured with MOS Transistor

In the filter circuit according to item 2, the first differential amplification circuit and the second differential amplification circuit include a MOS transistor.

In the noise of the MOS transistor, channel noise and flicker noise are dominant. Letting f be a frequency, W be the gate width of the MOS transistor, and L be the gate length of the MOS transistor, generally the flicker noise is improved in proportion to $1/(f \cdot W \cdot L)$. Particularly, in a low frequency band, the flicker noise is dominant. Therefore, in general, it is necessary to increase the gate width W and gate length L of the MOS transistor to reduce noise in the low frequency band. However, in the filter circuit according to item 3, the noise of the first differential amplification circuit is improved in proportion to $1/f$ by the characteristics of the differentiating circuit in the second circuit; therefore, the noise characteristics do not deteriorate significantly even though the gate width and gate length of the MOS transistor configuring the first differential amplification circuit are not increased. That is, according to the filter circuit of item 3, the first differential amplification circuit having a smaller area than that of the second differential amplification circuit can be used in the differentiating circuit in the second circuit, so that it is possible to implement a filter circuit in a smaller area.

[4] Determination of Feedback Amount Gh Based on Ratio Between Maximum Output Voltages of OP1 and OP2

In the filter circuit according to item 2 or 3, in the second resistance element and the third resistance element, a ratio ($Gh=R2/R3$) of a resistance value of the third resistance element to a resistance value of the second resistance element is equal to or greater than a ratio (Voutd_max/Vop2d_max) of a maximum output voltage of the second differential amplification circuit to a maximum output voltage of the first differential amplification circuit.

This makes it possible to suppress distortion in the output signal of the differentiating circuit in the second circuit and the output signal of the first circuit and prevent degradation in the linearity of the filter circuit.

[5] Rh>R2

In the filter circuit according to any one of items 2 to 4, the first resistance element has a resistance value larger than a resistance value of the third resistance element.

In the case where the second resistance element and the third resistance element have the same resistance value; by setting the resistance value of the first resistance element to be larger than the resistance value of the third resistance element, it is possible to decrease a required capacitance value in comparison with a filter circuit configured with an imperfect integrating circuit and implement a filter circuit in a smaller area.

[6] Addition of C1

In the filter circuit according to any one of items 2 to 5, the first circuit further has a second capacitance element (C1_A, C1_B) placed in parallel to the third resistance element.

For example, in the case where the first differential amplification circuit does not have a sufficient gain bandwidth, the impedance of the first capacitance element becomes very low in comparison with the first resistance element at high frequencies, which might cause oscillation of the first differential amplification circuit or a reduction in the amount of suppression. Therefore, in the filter circuit according to item 6, the second capacitance element is placed in parallel with the third resistance element between the input and output of the second differential amplification circuit, thereby configuring the first circuit as an imperfect integrating circuit. Thereby, the filter circuit according to item 6 has filter characteristics further having a cutoff frequency based on the third resistance element and the second capacitance element in addition to the cutoff frequency based on the first resistance element and the first capacitance element. Therefore, for example, by setting the cutoff frequency based on the third resistance element and the second capacitance element to be higher than the cutoff frequency based on the first resistance element and the first capacitance element, it is possible to suppress out-of-passband signals while preventing the oscillation at high frequencies without influencing the gain in the frequency band of the filter circuit.

[7] Addition of R4

In the filter circuit according to any one of items 1 to 6, the second circuit further has a fourth resistance element (R4_A, R4_B) placed in series to a series path of the input of the first differential amplification circuit and the first capacitance element.

As described above, an insufficient gain bandwidth of the first differential amplification circuit might cause oscillation of the first differential amplification circuit or a reduction in the amount of suppression at high frequencies. Therefore, in the filter circuit according to item 7, the fourth resistance element is coupled in series with the first capacitance element, thereby configuring the second circuit as an imperfect differentiating circuit. This can prevent the impedance of the series path of the input of the first differential amplification circuit and the first capacitance element from significantly dropping at high frequencies to prevent the oscillation of the first differential amplification circuit at high frequencies. Further, by making compensation obtained by combining the fourth resistance element and the second capacitance element, it is possible to enhance stability at high frequencies.

[8] Addition of C2

In the filter circuit according to any one of items 1 to 7, the second circuit further has a third capacitance element (C2_A, C2_B) placed in parallel to the first resistance element.

As described above, an insufficient gain bandwidth of the first differential amplification circuit might cause oscillation of the first differential amplification circuit or a reduction in the amount of suppression at high frequencies. Therefore, in the filter circuit according to item 8, the third capacitance element is placed in parallel with the first resistance element. This can decrease the impedance of the negative feedback path between the input and output of the first differential amplification circuit at high frequencies to suppress the gain increase at high frequencies. Further, by making compensation obtained by combining the fourth resistance element, the second capacitance element, and the third capacitance element, it is possible to further enhance stability at high frequencies.

[9] First Circuit: Voltage Input (Inverting Amplification Circuit)

In the filter circuit according to any one of items 2 to 8, the first circuit further has a fifth resistance element (R1_A, R1_B), and the second differential amplification circuit receives the signal supplied to the input terminal through the fifth resistance element.

This enables voltage input to the first circuit.

[10] Switching of Filter Characteristics

The filter circuit according to any one of items 6 to 9 further has a switch element (SW_1 to SW_4) for switching connection and disconnection between the first circuit and the second circuit, and the second capacitance element has a variable capacitance value.

This enables various filter characteristics by combination of the connection and disconnection between the first circuit and the second circuit and the capacitance value of the second capacitance element.

[11] Receiving Device

A receiving device (40) according to an exemplary embodiment of the invention has an antenna unit (400) for receiving a signal, a conversion unit (420) for converting the signal received by the antenna unit into a baseband signal, a filter circuit (5_A, 5_B) for acquiring a signal in a frequency band corresponding to an intended communication system from the baseband signal converted by the conversion unit, and a control unit (408) for performing control for switching filter characteristics of the filter circuit. The filter circuit has a first circuit (11) which receives the baseband signal, amplifies an input signal, and outputs an amplified signal, a second circuit (20, 21, 22) which receives an output signal of the first circuit and is feedback-coupled to the input of the first circuit, and a switch element (SW_1 to SW_4) for switching connection and disconnection between the first circuit and the second circuit. The second circuit has a first capacitance element (Ch_A, Ch_B), a first differential amplification circuit (OP2) for receiving the output signal of the first circuit through the first capacitance element, a first resistance element (Rh_A, Rh_B) for forming a negative feedback path between the input and output of the first differential amplification circuit, and a second resistance element (R3_A, R3_B) for forming a negative feedback path between the output of the first differential amplification circuit and the input of the first circuit. The first circuit has a second differential amplification circuit (OP1) for receiving the baseband signal and a signal fed back through the second resistance element, a third resistance element (R2_A, R2_B) for forming a negative feedback path between the input and output of the second differential amplification circuit, and a second capacitance element (C1_A, C1_B) placed in parallel to the third resistance element. The second capacitance element has a variable capacitance value. The control unit controls the switch element and the capacitance value of the second capacitance element in accordance with the intended communication system.

This makes it possible to switch the filter characteristics of the filter circuit in the receiving device in accordance with the intended communication system. The filter circuit operates as a low-pass filter as a whole, and the cutoff frequency of the filter circuit as a low-pass filter is determined based on the product of the capacitance value of the first capacitance element and the resistance value of the first resistance element configuring the differentiating circuit. Therefore, as in item 1, by increasing the resistance value of the first resistance element, it is possible to suppress an increase in the area of the first capacitance element and reduce the area of the filter circuit. Further, as in item 1, even if the first resistance element is increased to reduce the area of the first capacitance element, it is possible to suppress an increase in noise. Furthermore, whether or not signal distortion occurs in the second circuit is determined according to the ratio between the maximum output voltage of the first differential amplification circuit and the maximum output voltage of the second differential amplification circuit and the ratio between the resistance value of the second resistance element and the resistance value of the third resistance element, and is independent of the magnitude of the resistance value of the first resistance element. Therefore, even if the resistance value of the first resistance element is increased to obtain filter characteristics of a low cutoff frequency, signal distortion in the second circuit does not increase, so that it is possible to implement a filter circuit with low distortion.

Further, as in item 6, even in the case where the first differential amplification circuit does not have a sufficient gain bandwidth; by setting the cutoff frequency based on the second capacitance element to be higher than the cutoff frequency of the whole filter circuit, it is possible to suppress out-of-band signals while preventing the oscillation at high frequencies without influencing the gain in the frequency band of the filter circuit in the receiving device.

[12] Specific Switching Method of Filter Characteristic Corresponding to Communication System In the receiving device according to item 11, if the intended communication system is a first communication mode (GSM), the control unit couples the first circuit and the second circuit by the switch element, and sets the capacitance value of the second capacitance element to a first capacitance value (21 pF). If the intended communication system is a second communication mode (WCDMA) having a higher frequency band than the first communication mode, the control unit disconnects the first circuit from the second circuit by the switch element, and sets the capacitance value of the second capacitance element to the first capacitance value. If the intended communication system is a third communication mode (LTE) having a higher frequency band than the second communication mode, the control unit disconnects the first circuit from the second circuit by the switch element, and sets the capacitance value of the second capacitance element to a second capacitance value (4 pF) smaller than the first capacitance value.

This makes it possible to easily change the filter characteristic corresponding to the intended communication system.

[13] Operational Amplifier Configured with MOS Transistor

In the receiving device according to item 11 or 12, the first differential amplification circuit and the second differential amplification circuit include a MOS transistor.

According to this, as in item 3, the first differential amplification circuit having a smaller area than that of the second differential amplification circuit can be used in the differentiating circuit in the second circuit, so that it is possible to implement a filter circuit in a smaller area.

[14] Determination of Feedback Amount Gh Based on Ratio Between Maximum Output Voltages of OP1 and OP2

In the receiving device according to any one of items 11 to 13, in the second resistance element and the third resistance element, a ratio (Gh=R2/R3) of a resistance value of the third resistance element to a resistance value of the second resistance element is equal to or greater than a ratio (Voutd_max/Vop2d_max) of a maximum output voltage of the second differential amplification circuit to a maximum output voltage of the first differential amplification circuit.

This makes it possible to suppress distortion in the output signal of the differentiating circuit in the second circuit and the output signal of the first circuit and prevent degradation in the linearity of the filter circuit.

[15] Rh>R2

In the receiving device according to any one of items 11 to 14, the first resistance element has a resistance value larger than a resistance value of the third resistance element.

According to this, as in item 5, in the case where the second resistance element and the third resistance element have the same resistance value, it is possible to decrease a required capacitance value in comparison with a filter circuit configured with an imperfect integrating circuit and implement a filter circuit in a smaller area.

[16] Addition of R4

In the receiving device according to any one of items 11 to 15, the second circuit further has a fourth resistance element (R4_A, R4_B) placed in series to a series path of the input of the first differential amplification circuit and the first capacitance element.

According to this, even in the case where the first differential amplification circuit does not have a sufficient gain bandwidth, it is possible to prevent the oscillation of the first differential amplification circuit at high frequencies as in item 7. Further, by making compensation obtained by combining the fourth resistance element and the second capacitance element, it is possible to enhance stability at high frequencies.

[17] Addition of C2

In the receiving device according to any one of items 11 to 16, the second circuit further has a third capacitance element (C2_A, C2_B) placed in parallel to the first resistance element.

According to this, even in the case where the first differential amplification circuit does not have a sufficient gain bandwidth, it is possible to suppress the gain increase at high frequencies as in item 8. Further, by making compensation obtained by combining the fourth resistance element, the second capacitance element, and the third capacitance element, it is possible to further enhance stability at high frequencies.

[18] First Circuit: Voltage Input (Inverting Amplification Circuit)

In the receiving device according to any one of items 11 to 17, the first circuit further has a fifth resistance element (R1_A, R1_B), and the second differential amplification circuit receives the baseband signal through the fifth resistance element.

This enables voltage input to the first circuit.

2. Details of Embodiments

Embodiments will be described in greater detail below.

First Embodiment

FIG. 1 is a block diagram showing an example of a filter circuit according to the first embodiment. Although not restricted, the filter circuit 1 shown in FIG. 1 is formed over a single semiconductor substrate made of, e.g., monocrystalline silicon, using a known CMOS integrated circuit manufacturing technology. The filter circuit 1 is comprised of a first circuit 10 which receives a signal supplied to input terminals Iinp, Iinm, amplifies the signal, and outputs the amplified signal to output terminals Voutp, Voutm and a second circuit 20 which receives the signal outputted to the output terminals Voutp, Voutm and is feedback-coupled to the input of the first circuit 10.

The first circuit 10 includes an operational amplifier OP1 and resistances R2_A, R2_B to configure a transimpedance amplifier. The operational amplifier OP1 is, for example, a fully differential operational amplifier having an inverting input terminal (− input terminal), a non-inverting input terminal (+ input terminal), an inverting output terminal (− output terminal), and a non-inverting output terminal (+ output terminal). An input current inputted from the input terminals Iinp, Iinm is converted to a voltage by the transimpedance amplifier comprised of the operational amplifier OP1 and the resistances R2_A, R2_B. Specific coupling relation is as follows. The plus input terminal Iinp is coupled to the inverting input terminal of the operational amplifier OP1, and the minus input terminal Iinm is coupled to the non-inverting input terminal. The non-inverting output terminal of the operational amplifier OP1 is coupled to the minus output terminal Voutm, and coupled to the inverting input terminal of the operational amplifier OP1 through the resistance R2_A. The inverting output terminal of the operational amplifier OP1 is coupled to the plus output terminal Voutp, and coupled to the non-inverting input terminal of the operational amplifier OP1 through the resistance R2_B. This forms a negative feedback path between the input and output of the operational amplifier OP1. In this embodiment, the resistances R2_A and R2_B have the same resistance value, and are also generically called a resistance R2.

The second circuit 20 includes an operational amplifier OP2, capacitances Ch_A, Ch_B, resistances Rh_A, Rh_B, and resistances R3_A, R3_B. The operational amplifier OP2, the capacitances Ch_A, Ch_B, and the resistances Rh_A, Rh_B configure a differentiating circuit (high-pass filter) 200. The operational amplifier OP2 is, for example, a fully differential operational amplifier like the operational amplifier OP1. The signal outputted to the output terminals Voutp, Voutm is inputted to the differentiating circuit 200, and a signal outputted from the differentiating circuit 200 is negatively fed back to the input of the first circuit 10 through the resistances R3_A, R3_B. Specific coupling relation is as follows. The inverting input terminal of the operational amplifier OP2 is coupled to the minus output terminal Voutm through the capacitance Ch_A, and the non-inverting input terminal is coupled to the plus output terminal Voutp through the capacitance Ch_B. A non-inverting output terminal Vop2$p$ of the operational amplifier OP2 is coupled to the inverting input terminal of the operational amplifier OP2 through the resistance Rh_A. Further, an inverting output terminal Vop2$m$ of the operational amplifier OP2 is coupled to the non-inverting input terminal of the operational amplifier OP2 through the resistance Rh_B. This forms a negative feedback path between the input and output of the operational amplifier OP2. Further, the non-inverting output terminal Vop2$p$ of the operational amplifier OP2 is coupled to the non-inverting input terminal of the operational amplifier OP1 through the resistance R3_B, and the inverting output terminal Vop2$m$ of the operational amplifier OP2 is coupled to the inverting input terminal of the operational amplifier OP1 through the resistance R3_A. This forms a negative feedback path between the output of the second circuit 20 and the input of the first circuit 10.

In this embodiment, the resistances Rh_A and Rh_B have the same resistance value, and are also generically called a resistance Rh. The resistances R3_A and R3_B have the same resistance value, and are also generically called a resistance R3. Further, the capacitances Ch_A and Ch_B have the same capacitance value, and are also generically called a capacitance Ch. Reference numeral Vop2$p$ denotes not only the non-inverting output terminal of the operational amplifier OP2 but also a node coupled to the non-inverting output terminal, and reference numeral Vop2$m$ denotes not only the inverting output terminal of the operational amplifier OP2 but also a node coupled to the inverting output terminal.

The filter characteristics of the filter circuit 1 will be detailed.

The signal outputted from the first circuit 10 to the output terminals Voutp, Voutm is differentiated by the differentiating circuit 200, and the differentiated voltage is outputted to the nodes Vop2$p$, Vop2$m$. Letting Iind be the differential input current of the first circuit 10, Voutd be the differential output voltage of the first circuit 10, and Vop2$d$ be the differential output voltage of the differentiating circuit 200, the transfer function $H_2(s)$ of the differentiating circuit 200 can be expressed by the following equation (2).

$$H_2(s) = \frac{V_{op2d}}{V_{outd}} = sC_h R_h \quad (2)$$

Since the output voltage Vop2$d$ of the differentiating circuit 200 is negatively fed back to the first circuit 10 and the amount of feedback current is controlled by the resistance R3, the transfer function $H_1(s)$ of the whole filter circuit 1 can be expressed by the following equation (3).

$$H_1(s) = \frac{V_{outd}}{I_{ind}} = \frac{G_1}{1 + G_h H_2(s)} \quad (3)$$

$$G_1 = R_2 \quad (4)$$

$$G_h = \frac{R_2}{R_3} \quad (5)$$

$$fc = \frac{1}{2\pi G_h C_h R_h} \quad (6)$$

As shown in equation (3), the filter circuit 1 operates as a low-pass filter circuit as a whole, and the DC gain can be set by equation (4). The feedback amount Gh of the signal fed back to the first circuit 10 from the differentiating circuit 200 is expressed by equation (5), and the cutoff frequency fc of the filter circuit 1 is expressed by equation (6).

The linearity of the filter circuit 1 is determined based on the feedback amount Gh, the maximum output voltage Voutd_max of the first circuit 10 (operational amplifier OP1), and the maximum output voltage Vop2$d$_max of the differentiating circuit 200 (operational amplifier OP2) in the band of frequencies less than fc. For example, assume that the maximum output voltages of the operational amplifiers OP1 and OP2 are both 1.0 V, the resistance R2=R, and the resistance R3=2R. In this case, since the feedback amount Gh=R2/R3=0.5, the operational amplifier OP2 needs to output an output voltage Vop2$d$ of 2.0 Vpp differential in order that the operational amplifier OP1 outputs an output voltage Voutd of 1.0 Vpp differential. However, since the maximum output voltage of the operational amplifiers OP2 is 1.0 Vpp differential, the operational amplifiers OP2 can only output voltages up to 1.0 Vpp differential, so that the output voltage Vop2$d$ of the operational amplifiers OP2 becomes distorted. Therefore, to maintain the linearity of the filter circuit 1, the feedback amount Gh is determined so as to satisfy equation (7). According to equation (7), in the case where the maximum output voltage of the operational amplifier OP1 is the same as that of the operational amplifier OP2, if the feedback amount Gh is equal to or greater than 1, the linearity of the filter circuit 1 can be maintained.

$$G_h \geq \frac{V_{outd\_max}}{V_{op2d\_max}} \quad (7)$$

The cutoff frequency fc of the filter circuit 1 is provided by equation (6) as described above. Therefore, according to the filter circuit 1, it is possible to obtain the desired cutoff frequency fc with the capacitance Ch which is as small as R2/Gh·Rh of a capacitance in a general imperfect integrating circuit. For example, in the case where the maximum output voltage of the operational amplifier OP1 is the same as that of the operational amplifier OP2, and the ratio of the resistance R2 to the resistance R3 is one to one (Gh=1) to maintain the linearity of the filter circuit 1, the resistance Rh is set to be larger than the resistance R2. This makes it possible to decrease the required capacitance, in comparison with the filter circuit configured with the general imperfect integrating circuit. Further, as described above, to maintain the linearity of the filter circuit 1, the feedback amount Gh is determined so as to satisfy equation (7). Therefore, the linearity of the filter circuit 1 is independent of the magnitude of the resistance Rh. For example, the output voltage Vop2d of the differentiating circuit 200 is expressed by equation (8) and is independent of the resistance Rh; therefore, an increase in the resistance Rh does not degrade the linearity of the differentiating circuit 200 and the first circuit 10. Accordingly, the increase in the resistance Rh can reduce the area of the filter circuit 1 while maintaining the linearity of the filter circuit 1.

$$V_{op2d} = \frac{V_{outd}}{G_h} = \frac{R_3}{R_2} V_{outd} \quad (8)$$

As will be described in detail later, noise inputted to the differentiating circuit 200 is amplified by Gh times, and the amplified noise appears at the output of the first circuit 10 and might be larger if the feedback amount Gh is larger than "1". However, as far as noise characteristics are acceptable, by increasing the feedback amount Gh to a value (e.g., 1.5 to 2) larger than 1, it is possible to further reduce the area of the capacitance Ch as shown in equation (6).

Next, the noise characteristics of the filter circuit 1 will be described.

The transfer function of noise of the differentiating circuit 200 is similarly expressed by equation (2) for example. That is, the noise voltage of the differentiating circuit 200 increases in proportion to the frequency f. Further, since the resistance generates thermal noise as described above, the noise voltage of the differentiating circuit 200 increases in proportion to the resistance Rh. Further, noise inputted to the differentiating circuit 200 is amplified by Gh times, and the amplified noise appears at the output of the first circuit 10. However, since the differentiating circuit 200 suppresses signals in the band of frequencies less than fc, output noise in the band of frequencies less than fc is filtered by the differentiating circuit 200. Therefore, even if the capacitance Ch is decreased and the resistance Rh is increased to lower the cutoff frequency of the filter circuit 1, it is possible to suppress the noise in the band of frequencies less than fc.

The operational amplifiers OP1, OP2 include, for example, MOS transistors (MOS-FETs). Consideration will be given to noise in this configuration. An input conversion noise current of the operational amplifier OP1 is current-voltage converted by G1 times, and the converted voltage appears at the output of the first circuit 10. Generally, in the noise of the operational amplifier configured with MOS-FETs, channel noise and flicker noise are dominant. Letting f be a frequency, W be a gate width of a MOS-FET, and L be a gate length, the channel noise is improved in proportion to W/L, and the flicker noise is improved in proportion to 1/(f·W·L). Particularly, in a low frequency band, the flicker noise is dominant. Therefore, in general, it is necessary to increase the gate width W and gate length L of the MOS transistor configuring the operational amplifier to reduce noise in the low frequency band. On the other hand, by the differentiating circuit 200, the input conversion noise voltage of the operational amplifier OP2 is not outputted in the band of frequencies less than fc. That is, since the noise of the operational amplifier OP2 is improved in proportion to 1/f by the characteristics of the differentiating circuit 200, the noise characteristics do not deteriorate significantly even though the gate width and gate length of the MOS transistor configuring the operational amplifier OP2 are not increased. Therefore, since the noise characteristics do not deteriorate significantly even though the operational amplifier OP2 is configured with the MOS-FET that is smaller in size than the MOS-FET configuring the operational amplifier OP1, it is possible to reduce the area of the operational amplifier OP2 in comparison with that of the operational amplifier OP1.

As described above, the filter circuit 1 according to the first embodiment operates as a low-pass filter as a whole, and the cutoff frequency fc thereof is determined based on the product of the resistance Rh and the capacitance Ch configuring the differentiating circuit 200. Accordingly, by increasing the resistance Rh, it is possible to lower the cutoff frequency without increasing the capacitance Ch, which can reduce the area of the filter circuit. Since the linearity of the filter circuit 1 is determined based on the relation between the feedback amount Gh and the maximum output voltages of the operational amplifiers OP1, OP2, an increase in the resistance Rh does not increase signal distortion in the filter circuit 1. Further, since the filter circuit 1 is configured with the differentiating circuit 200, it is possible to suppress an increase in noise associated with the increase in the resistance Rh in the band of frequencies less than fc. Further, since the differentiating circuit 200 can suppress the flicker noise in the low frequency band in the operational amplifier OP2, it is possible to reduce the area of the operational amplifier OP2 in comparison with that of the operational amplifier OP1. Therefore, according to the filter circuit 1 of the first embodiment, it is possible to implement a filter circuit with a low cutoff frequency, low noise, and low distortion in a smaller area.

Second Embodiment

Figure 2:
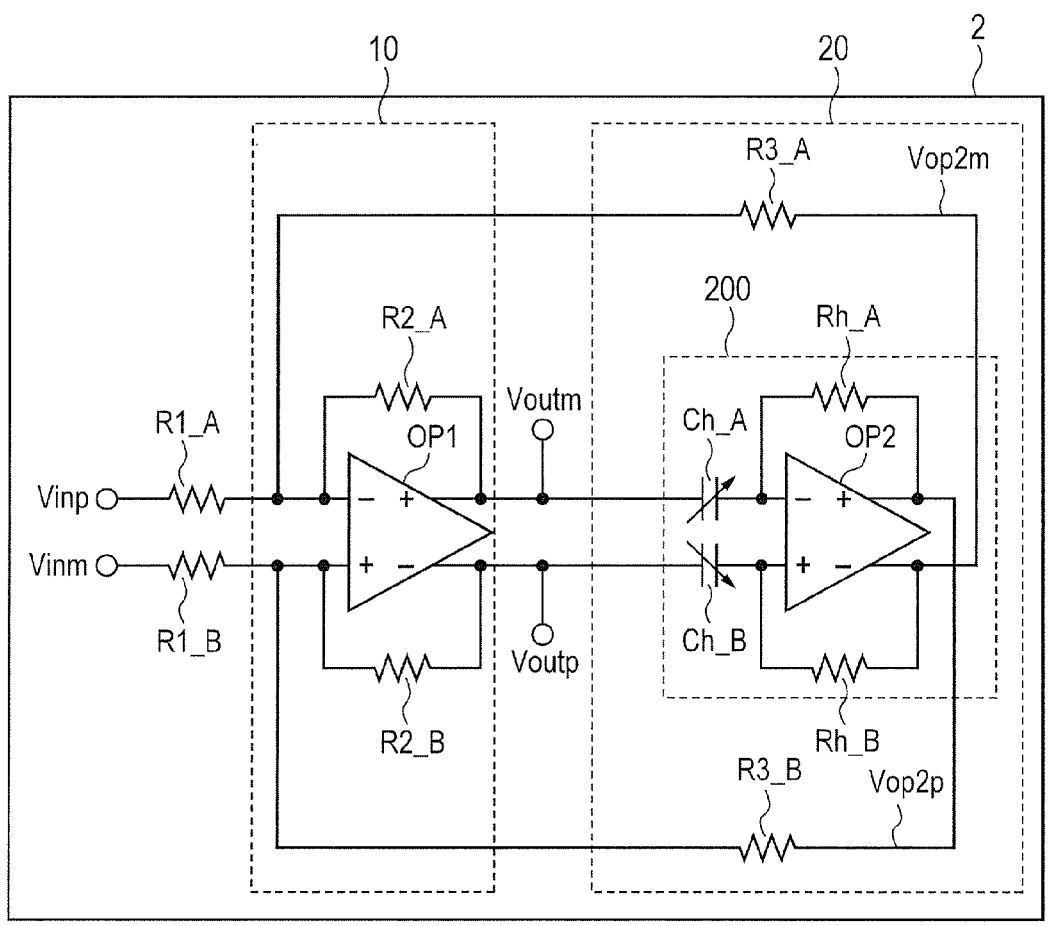
FIG. 2 is a block diagram showing an example of a filter circuit according to a second embodiment.

FIG. 2 is a block diagram showing an example of a filter circuit according to the second embodiment. In FIG. 2, the same components as those of the filter circuit 1 according to the first embodiment are denoted by the same reference numerals, and detailed description thereof is omitted.

While the filter circuit 1 is a current input filter circuit, the filter circuit 2 shown in FIG. 2 is a voltage input filter circuit. Specifically, a resistance R1_A is inserted between a plus input terminal Vinp and the inverting input terminal of the operational amplifier OP1, and a resistance R1_B is inserted between a minus input terminal Vinm and the non-inverting input terminal of the operational amplifier OP1. The other circuit configuration of the filter circuit 2 is the same as that of the filter circuit 1.

In FIG. 2, letting Vind be the differential input voltage between the input terminal Vinp and the input terminal Vinm, the differential input current Iind inputted to the first circuit 10 can be expressed by the following equation (9). The resistances R1_A and R1_B have the same resistance value, and are also generically called a resistance R1.

$$I_{ind} = \frac{V_{ind}}{R_1} \quad (9)$$

From equation (9), the transfer function $H_1{}'(s)$ of the whole filter circuit 2 can be expressed by the following equation (10).

$$H_1'(s) = \frac{V_{outd}}{V_{ind}} = \frac{G_1'}{1 + G_h H_2(s)} \quad (10)$$

$$G_1' = -\frac{R_2}{R_1} \quad (11)$$

As shown in equations (10) and (11), in the filter circuit 2, it is possible to control the DC gain by adjusting the input current by the resistance R1. The other characteristics are the same as those of the filter circuit 1.

Thus, according to the filter circuit 2 of the second embodiment, it is possible to implement a voltage input filter circuit with a low cutoff frequency, low noise, and low distortion in a smaller area.

Third Embodiment

Figure 3:
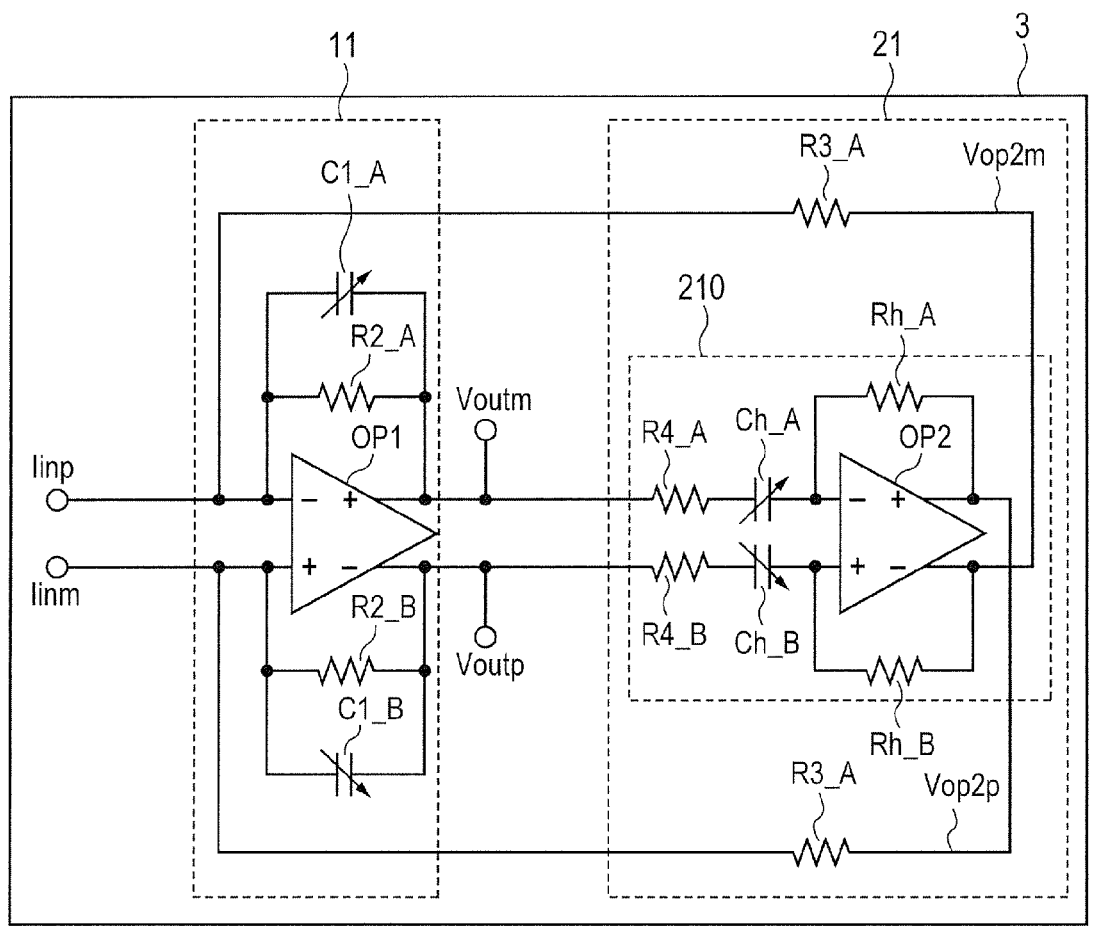
FIG. 3 is a block diagram showing an example of a filter circuit according to a third embodiment.

FIG. 3 is a block diagram showing an example of a filter circuit according to the third embodiment. In FIG. 3, the same components as those of the filter circuit 1 according to the first embodiment are denoted by the same reference numerals, and detailed description thereof is omitted.

The filter circuit 3 shown in FIG. 3 has improved stability of the circuit in the case where the operational amplifier OP2 in the filter circuit 1 does not have a sufficient gain bandwidth. The filter circuit 3 differs from the filter circuit 1 in that a first circuit 11 configures an imperfect integrating circuit and a differentiating circuit 210 of a second circuit 21 configures an imperfect differentiating circuit. Specifically, in the first circuit 11, a capacitance C1_A is coupled in parallel with the resistance R2_A, and a capacitance C1_B is coupled in parallel with the resistance R2_B. Further, in the differentiating circuit 210, a resistance R4_A is coupled in series between the output terminal Voutm and the capacitance Ch_A, and a resistance R4_B is coupled in series between the output terminal Voutp and the capacitance Ch_B. In the following description, the resistances R4_A and R4_B have the same resistance value, and are also generically called a resistance R4. Further, the capacitances C1_A and C1_B have the same capacitance value, and are also generically called a capacitance C1.

Figure 4:
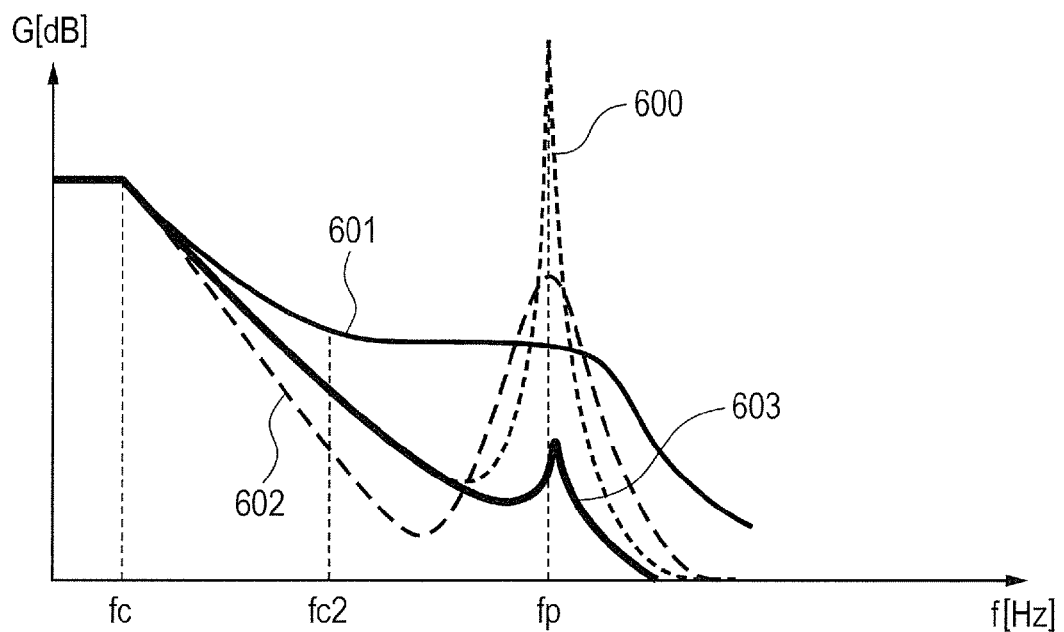
FIG. 4 is an explanatory diagram showing an example of the frequency characteristics of the filter circuit 3.

FIG. 4 illustrates the frequency characteristics of the filter circuit 3. In FIG. 4, the vertical axis represents the gain G [dB], and the horizontal axis represents the frequency f [Hz]. Reference numeral 600 represents the gain characteristic of the filter circuit 1 in the case where the operational amplifier OP2 does not have a sufficient gain bandwidth. Reference numeral 601 represents the gain characteristic of a filter circuit obtained by coupling the resistance R4 in series with the capacitance Ch in the filter circuit 1. Reference numeral 602 represents the gain characteristic of a filter circuit obtained by coupling the capacitance C1 in parallel with the resistance R2 in the filter circuit 1. Reference numeral 603 represents the gain characteristic of the filter circuit 3.

As shown by reference numeral 600, in the case where the operational amplifier OP2 does not have a sufficient gain bandwidth; if no compensation is made, the impedance of the capacitance Ch becomes very low in comparison with the resistance Rh at high frequencies, so that the operational amplifier OP2 oscillates at an oscillation frequency fp at which a high-gain peak appears. Therefore, the following compensation will be made to prevent the oscillation of the operational amplifier OP2.

In a first compensation method, the resistance R4 is coupled in series to the capacitance Ch as shown in FIG. 3. This can prevent the impedance of a path from the output terminals Voutm, Voutp to the input of the operational amplifier OP2 from excessively dropping at high frequencies. Thereby, as shown by reference numeral 601 in FIG. 4, it is possible to suppress the gain peak at the frequency fp to prevent the oscillation. However, from a low frequency band around a frequency fc2, the amount of gain suppression is reduced, as shown by reference numeral 601.

In a second compensation method, the capacitance C1 is coupled in parallel to the resistance R2 as shown in FIG. 3. In this configuration, a new filter circuit is added to the filter circuit 1. That is, the cutoff frequency fc2 of the imperfect integrating circuit (low-pass filter) comprised of the resistance R2 and the capacitance C1 is added to the filter characteristics of the filter circuit 1, thus providing the resultant filter characteristics. The cutoff frequency fc2 is expressed, for example, by equation (12).

$$fc2 = \frac{1}{2\pi R_2 C_1} \quad (12)$$

$$fc \ll fc2 \quad (13)$$

As shown in equation (13), the cutoff frequency fc2 is set to be substantially higher than the cutoff frequency fc expressed by equation (6). Thereby, as shown by reference numeral 602 in FIG. 4, it is possible to suppress the gain peak at the frequency fp to prevent the oscillation without influencing the gain in the frequency band lower than the cutoff frequency fc and obtain the amount of suppression at out-of-band frequencies more than fc.

A third compensation method is the combination of the first compensation method and the second compensation method. Specifically, the resistance R4 is coupled in series to the capacitance Ch, and the capacitance C1 is coupled in parallel to the resistance R2, as shown in FIG. 3. The capacitance C1 makes it possible to obtain the amount of gain suppression in the high frequency range and therefore compensate for the influence of the finite gain bandwidth of the operational amplifier OP2. Further, the resistance R4 suppresses the gain increase in the high frequency range for phase compensation. Thereby, as shown by reference numeral 603 in FIG. 4, it is possible to further suppress the gain peak at the frequency fp to prevent the oscillation and obtain the amount of suppression at out-of-band frequencies more than fc.

In general, to increase the gain bandwidth of the operational amplifier, it is necessary to increase the area and current. However, according to the filter circuit 3 of the third embodiment, even though the operational amplifier OP2 does not have a sufficient gain bandwidth, it is possible to compensate for the influence and stabilize the operation of the whole filter circuit. Therefore, even though the operational amplifier OP2 having a low gain bandwidth is used to reduce the area and current, it is possible to implement a filter circuit with a low cutoff frequency, low noise, and low distortion in a smaller area, like the filter circuit 1.

Fourth Embodiment

Figure 5:
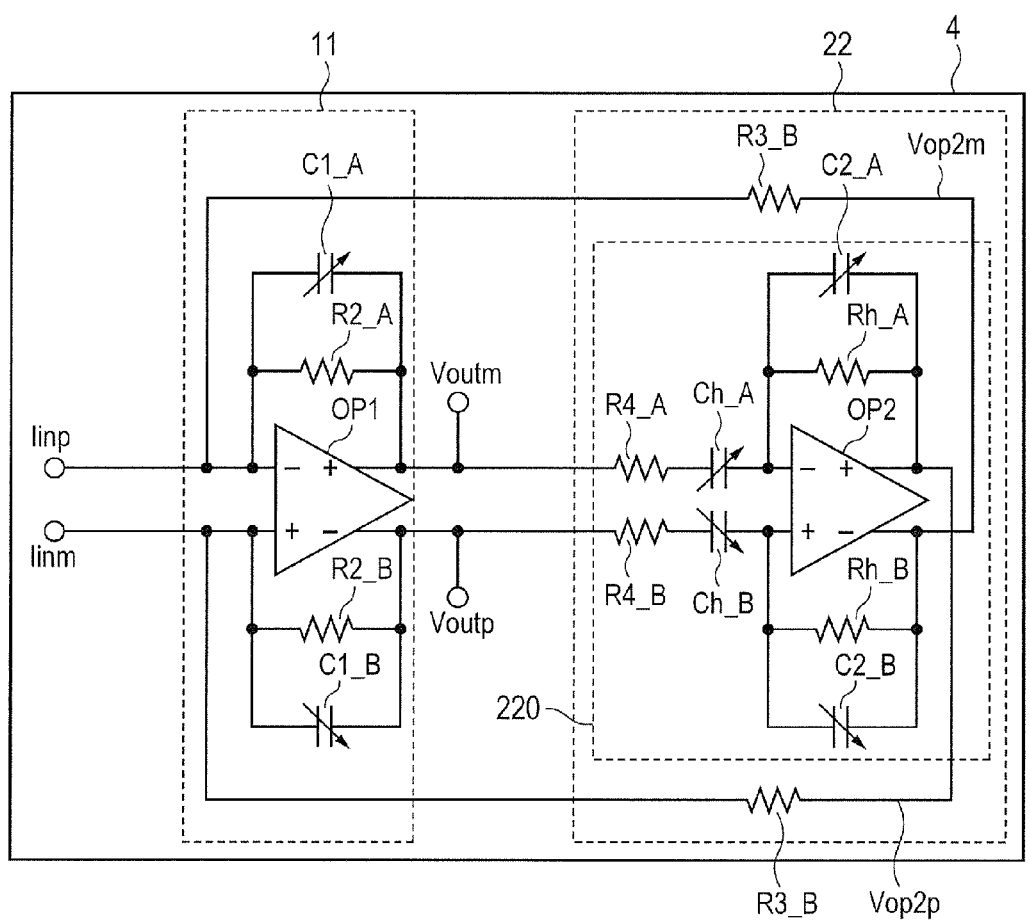
FIG. 5 is a block diagram showing an example of a filter circuit according to a fourth embodiment.

FIG. 5 is a block diagram showing an example of a filter circuit according to the fourth embodiment. In FIG. 5, the same components as those of the filter circuits 1 to 3 are denoted by the same reference numerals, and detailed description thereof is omitted.

The filter circuit 4 shown in FIG. 5 has improved stability of the circuit in the case where the operational amplifier OP2 does not have a sufficient gain bandwidth, like the filter circuit 3. Specifically, FIG. 5 differs from FIG. 3 in that a capacitance C2_A is coupled in parallel to the resistance Rh_A and a capacitance C2_B is coupled in parallel to the resistance Rh_B in a differentiating circuit 220. In the following description, the capacitances C2_A and C2_B have the same capacitance value, and are also generically called a capacitance C2.

Figure 6:
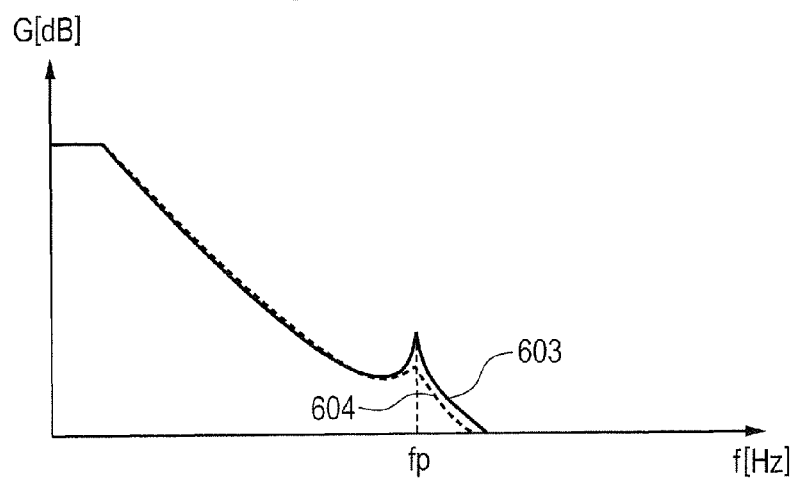
FIG. 6 is an explanatory diagram showing an example of the frequency characteristics of the filter circuit 4.

FIG. 6 illustrates the frequency characteristics of the filter circuit 4. In FIG. 6, the vertical axis represents the gain G [dB], and the horizontal axis represents the frequency f [Hz]. Reference numeral 603 represents the gain characteristic of the filter circuit 3, and reference numeral 604 represents the gain characteristic of the filter circuit 4.

In the filter circuit 4, the capacitance C2 is coupled in parallel with the resistance Rh. Thereby, since the impedance of the compensation capacitance C2 decreases at higher frequencies, it is possible to decrease the impedance of the negative feedback path between the input and output of the operational amplifier OP2 to suppress the gain increase at the frequency fp. Therefore, as shown by reference numeral 604 in FIG. 6, it is possible to further reduce the peak at the frequency fp in comparison with the compensation method by the filter circuit 3.

Thus, according to the filter circuit 4 of the fourth embodiment, even though the operational amplifier OP2 does not have a sufficient gain bandwidth, it is possible to compensate for the influence and further improve the stability of the whole filter circuit. The necessity of the capacitance C1 and the capacitance C2 is related to the gain bandwidth and phase margin of the operational amplifier OP2. For example, if the characteristics of the whole filter circuit are unstable and the amount of suppression in the high frequency range is insufficient, any one or two or all of the capacitance C1, the capacitance C2, and the resistance R4 can be added.

Fifth Embodiment

Figure 7:
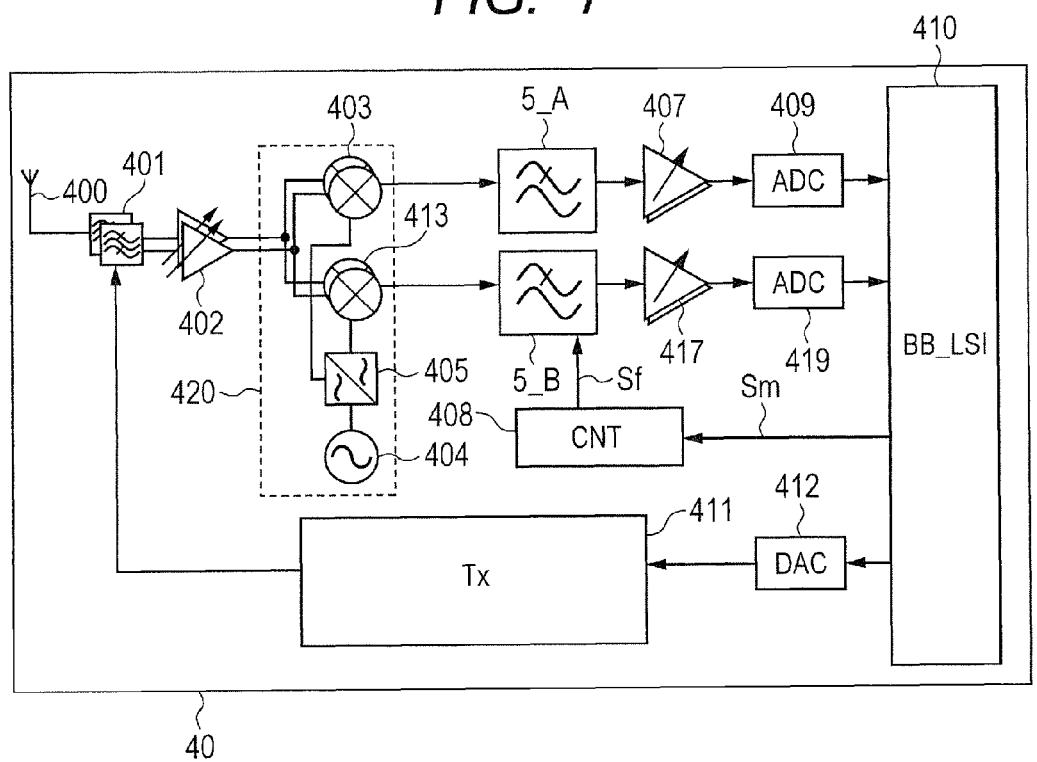
FIG. 7 is a block diagram showing an example of a multimode transmitting/receiving device for supporting multiple communication systems.

FIG. 7 is a block diagram showing an example of a multi-mode transmitting/receiving device for supporting multiple communication systems. The transmitting/receiving device 40 shown in FIG. 7 is, for example, a transmitting/receiving device for supporting GSM, WCDMA, LTE of a quadrature down-conversion system having a two-channel analog baseband unit of an I channel of an in-phase component and a Q channel of a quadrature component.

The transmitting/receiving device 40 includes, for example, a transmitting and receiving antenna 400, a front-end module 401 comprised of an antenna switch and an RF filter, a low noise amplifier 402, a conversion unit 420, an I-signal filter circuit 5_A, a Q-signal filter circuit 5_B, an I-signal variable gain amplifier 407, a Q-signal variable gain amplifier 417, an I-signal analog/digital converter (ADC) 409, a Q-signal analog/digital converter (ADC) 419, a control unit (CNT) 408, a baseband signal processing LSI (BB_LSI) 410, a digital/analog converter (DAC) 412, and an RF transmission signal generation unit (Tx) 411. Although not restricted, the low noise amplifier 402, the conversion unit 420, the I-signal filter circuit 5_A, the Q-signal filter circuit 5_B, the I-signal variable gain amplifier 407, the Q-signal variable gain amplifier 417, the I-signal analog/digital converter (ADC) 409, the Q-signal analog/digital converter (ADC) 419, the control unit (CNT) 408, the digital/analog converter (DAC) 412, and the RF transmission signal generation unit (Tx) 411 are configured as an RFIC formed over a single semiconductor substrate made of, e.g., monocrystalline silicon, using a known CMOS integrated circuit manufacturing technology.

An RF reception signal received by the antenna 400 is supplied to the input terminal of the low noise amplifier 402 through the front-end module 401. The low noise amplifier 402 amplifies the inputted signal, and outputs the amplified signal as an RF reception amplification signal to the conversion unit 420.

The conversion unit 420 includes, for example, an I-signal mixer 403, a Q-signal mixer 413, a 90-degree phase shifter 405, and a local signal oscillator 404. The 90-degree phase shifter 405 generates an I local signal and a Q local signal having a phase difference of 90 degrees from the I local signal, based on a signal outputted from the local signal oscillator 404. The I local signal is supplied to the I-signal mixer 403, and the Q local signal is supplied to the Q-signal mixer 413.

The I-signal mixer 403 and the Q-signal mixer 413 configure a quadrature down-conversion mixer. The I-signal mixer 403 generates an I baseband signal based on the RF reception amplification signal and the I local signal, and outputs it to the I-signal filter circuit 5_A. The Q-signal mixer 413 generates a Q baseband signal based on the RF reception amplification signal and the Q local signal, and outputs it to the Q-signal filter circuit 5_B.

The I-signal filter circuit 5_A and the Q-signal filter circuit 5_B extract a signal in a frequency band corresponding to an intended communication system (communication mode) from the I baseband signal and the Q baseband signal, based on a filter switching signal Sf from the control unit 408 described later. The details of the I-signal filter circuit 5_A and the Q-signal filter circuit 5_B will be described later.

The I baseband signal outputted from the I-signal filter circuit 5_A is inputted to the I-signal variable gain amplifier 407, and the Q baseband signal outputted from the Q-signal filter circuit 5_B is inputted to the Q-signal variable gain amplifier 417, and the respective baseband signals are amplified. The analog I baseband signal amplified by the I-signal variable gain amplifier 407 is converted by the I-signal analog/digital converter 409 into a digital I baseband signal, which is supplied to the baseband signal processing LSI 410. The analog Q baseband signal amplified by the Q-signal variable gain amplifier 417 is converted by the Q-signal analog/digital converter 419 into a digital Q baseband signal, which is supplied to the baseband signal processing LSI 410.

The baseband signal processing LSI 410 demodulates the supplied digital I baseband signal and Q baseband signal in accordance with the intended communication system (communication mode), thereby acquiring necessary information from the received RF signal. Further, the baseband signal processing LSI 410 generates a communication mode selection signal Sm for selecting which communication mode signal to receive. The communication mode selection signal Sm specifies any of the three communication modes of GSM, WCDMA, and LTE for example. The communication mode selection signal Sm is inputted to, for example, the control unit 408.

The baseband signal processing LSI 410 further generates a transmission signal. For example, the baseband signal processing LSI 410 generates a digital baseband transmission signal in accordance with a communication mode for transmission, and outputs it to the digital/analog converter 412. The digital/analog converter 412 converts the digital baseband transmission signal into an analog baseband transmission signal, and outputs it to the RF transmission signal generation unit 411. The RF transmission signal generation unit 411 generates an RF transmission signal based on the analog baseband transmission signal. The generated RF transmission signal is supplied to the antenna 400 through the front-end module 401, and transmitted.

The control unit 408 controls the I-signal filter circuit 5_A and the Q-signal filter circuit 5_B to have a filter characteristic corresponding to a communication mode specified by the communication mode selection signal Sm. Specifically, the control unit 408 generates a filter switching signal Sf based on the communication mode selection signal Sm, and switches the filter characteristics of the I-signal filter circuit 5_A and the Q-signal filter circuit 5_B by the filter switching signal Sf. The I-signal filter circuit 5_A and the Q-signal filter circuit 5_B are switched by the filter switching signal Sf so as to have the filter characteristic suited to each preset communication mode.

The I-signal filter circuit 5_A and the Q-signal filter circuit 5_B will be described in detail.

Since the basic filter circuit configurations of the I-signal filter circuit 5_A and the Q-signal filter circuit 5_B are the same, the I-signal filter circuit 5_A and the Q-signal filter circuit 5_B are simply called a filter circuit 5, and the circuit configuration thereof will be described.

Figures 8, 9:
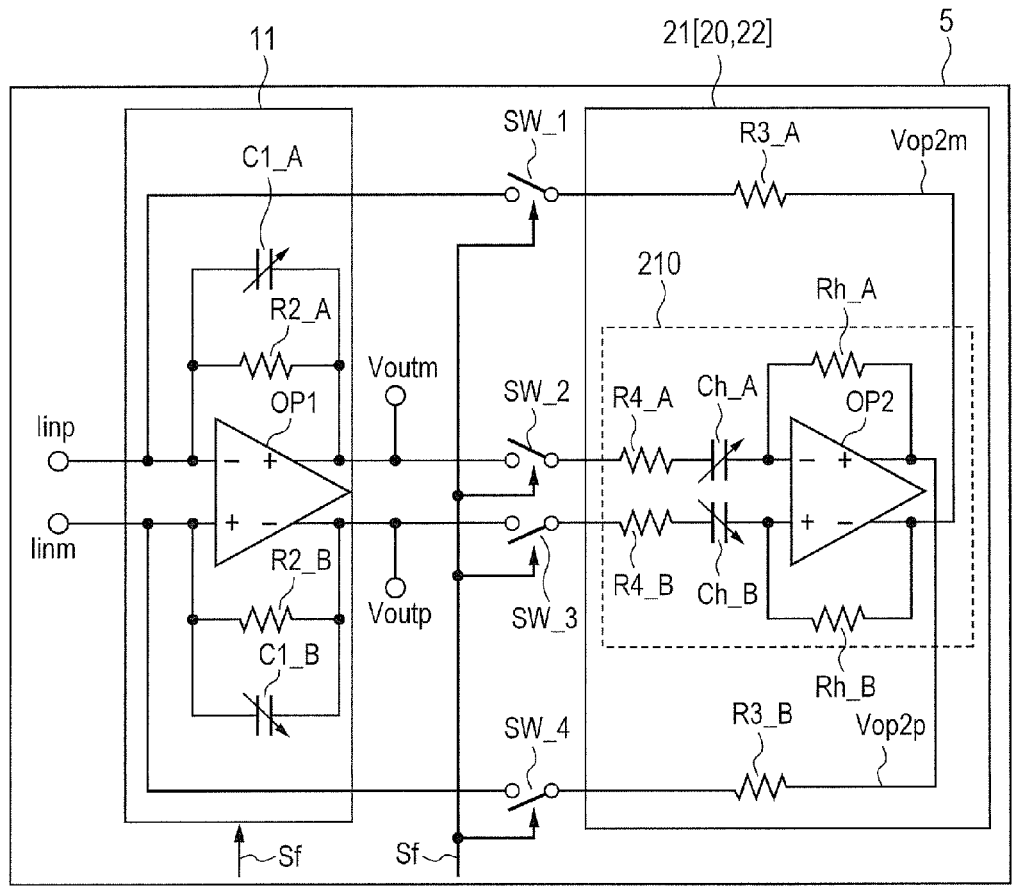
FIG. 8 is a block diagram showing an example of a filter circuit 5.
FIG. 9 is an explanatory diagram showing an example of a method for controlling switch elements SW_1 to SW_4 and a capacitance C1.

FIG. 8 is a block diagram showing an example of the filter circuit 5. In FIG. 8, the same components as those of the filter circuits 1 to 4 are denoted by the same reference numerals, and detailed description thereof is omitted. While FIG. 8 representatively illustrates the second circuit 21 including the differentiating circuit in the filter circuit 5, the invention is not limited thereto. For example, the second circuit 20 or 22 may be used in place of the second circuit 21.

The filter circuit 5 is based on the circuit configuration of the above-described filter circuit 3 in FIG. 3, and includes switch elements SW_1 to SW_4 for switching the connection and disconnection between the first circuit 11 and the second circuit 21. Specifically, the switch element SW_1 is inserted in a path that couples the resistance R3_A and the input terminal Iinp, and the switch element SW_4 is inserted in a path that couples the resistance R3_B and the input terminal Iinm. Further, the switch element SW_2 is inserted in a path that couples the resistance R4_A and the output terminal Voutm, and the switch element SW_3 is inserted in a path that couples the resistance R4_B and the output terminal Voutp. The capacitances C1_A, C1_B have variable capacitance values.

The switching of the filter characteristics of the filter circuit 5 is controlled by the filter switching signal Sf. Specifically, the on/off switching of the switch elements SW_1 to SW_4 and the capacitance value of the capacitance C1 in the first circuit 11 are controlled by the filter switching signal Sf.

FIG. 9 illustrates a method for controlling the switch elements SW_1 to SW_4 and the capacitance C1 in accordance with each communication mode. As shown in FIG. 9, if the communication mode is GSM, for example, the switch elements SW_1 to SW_4 are closed to be turned on, and the capacitance value of the capacitance C1 is set to 21 pF. If the communication mode is WCDMA, for example, the switch elements SW_1 to SW_4 are opened to be turned off, and the capacitance value of the capacitance C1 is set to 21 pF. If the communication mode is LTE, for example, the switch elements SW_1 to SW_4 are opened to be turned off, and the capacitance value of the capacitance C1 is set to 4 pF. Here, assume that the value of the resistance R2 in the filter circuit 5 is 4 kΩ. If the communication mode is GSM, the cutoff frequency fc of the filter circuit 5 is 135 kHz. If the communication mode is WCDMA, the cutoff frequency fc of the filter circuit 5 is 1.92 MHz. If the communication mode is LTE, the cutoff frequency fc of the filter circuit 5 is 10 MHz. While the cutoff frequency suitable for GSM reception is 135 kHz, the cutoff frequency suitable for WCDMA reception is 1.92 MHz, and the cutoff frequency suitable for LTE reception with a bandwidth of 20 MHz is 10 MHz in FIG. 9, the cutoff frequency is one example, and is not limited thereto.

Figure 10:
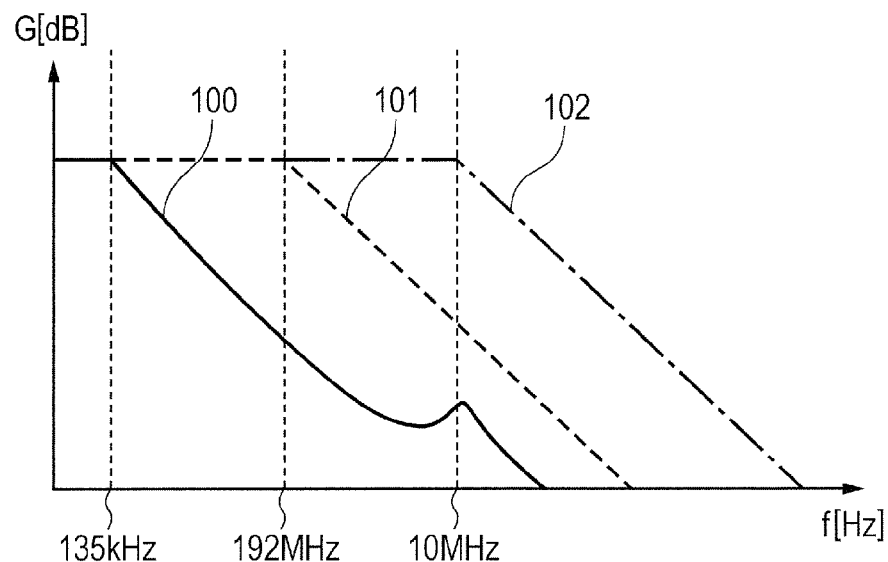
FIG. 10 is an explanatory diagram showing an example of the filter characteristics of the filter circuit 5 corresponding to communication modes.

FIG. 10 illustrates the filter characteristics of the filter circuit 5 corresponding to the communication modes. In FIG. 10, the horizontal axis represents the frequency f [Hz], and the vertical axis represents the gain G [dB]. FIG. 10 illustrates the filter characteristics obtained by switching the switch elements SW_1 to SW_4 and the capacitance C1 in accordance with FIG. 9. Among the filter characteristics of the filter circuit 5 in FIG. 10, reference numeral 100 represents a characteristic in GSM mode, reference numeral 101 represents a characteristic in WCDMA mode, and reference numeral 102 represents a characteristic in LTE mode.

Figure 11:
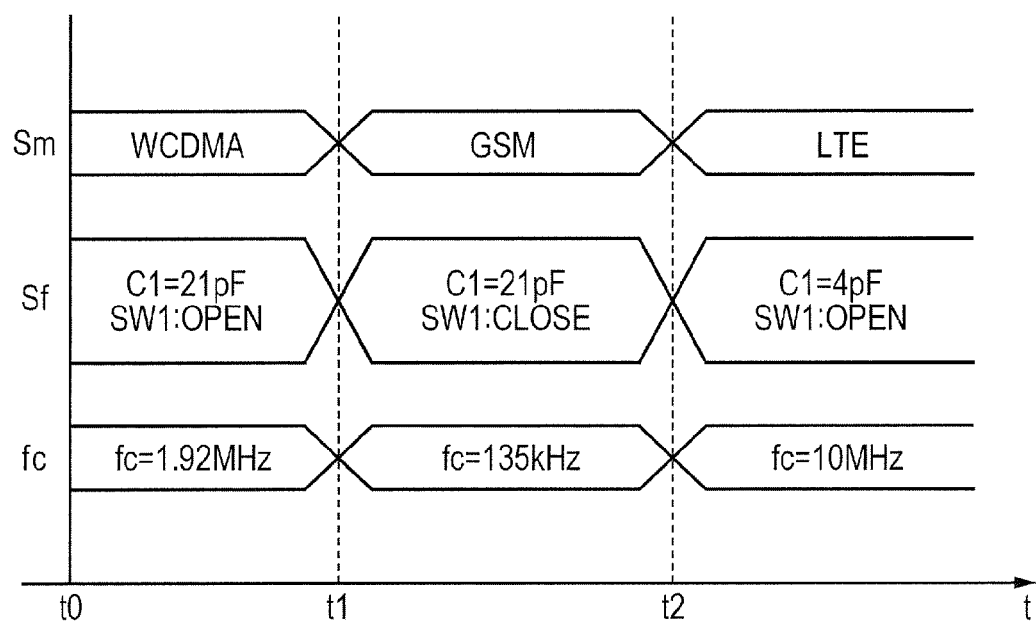
FIG. 11 is an explanatory diagram showing an example of timing at the switching of the communication modes.
Figure 12:
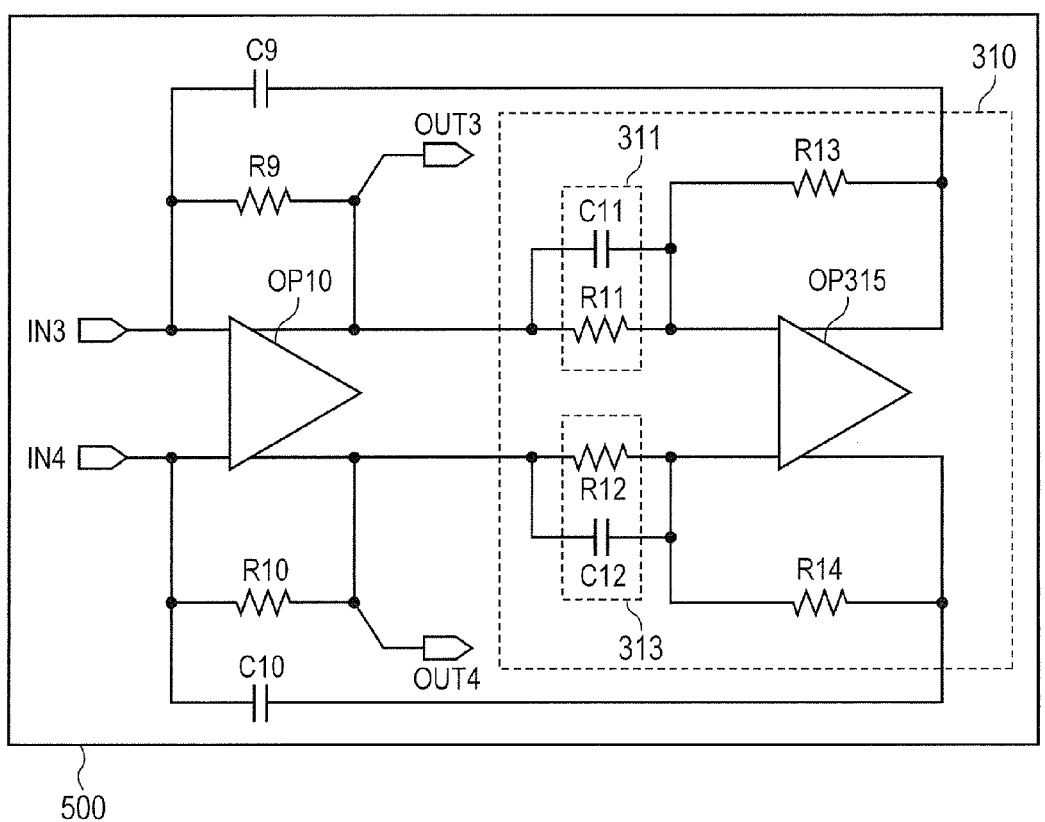
FIG. 12 is a circuit diagram showing the circuit configuration of a filter circuit described in Patent Document 1.

FIG. 11 is an explanatory diagram showing an example of timing at the switching of the communication modes.

In FIG. 11, assume that the transmitting/receiving device 40 receives a WCDMA signal at time t0. At this time, the communication mode selection signal Sm outputted from the baseband signal processing LSI 410 specifies WCDMA. The control unit 408 turns off (opens) the switch elements SW_1 to SW_4 in the I-signal filter circuit 5_A and the Q-signal filter circuit 5_B and sets the capacitance value of the capacitance C1 to 21 pF, by controlling the filter switching signal Sf based on the arrangement in FIG. 9. Thereby, in the filter circuit 5, the second circuit 21 is disconnected, and the cutoff frequency fc is set to 1.92 MHz.

Then, the transmitting/receiving device 40 switches the reception communication mode to GSM at time t1. At this time, the baseband signal processing LSI 410 outputs the communication mode selection signal Sm specifying GSM. In response thereto, the control unit 408 turns on (closes) the switch elements SW_1 to SW_4 in the I-signal filter circuit 5_A and the Q-signal filter circuit 5_B by controlling the filter switching signal Sf based on the arrangement in FIG. 9. The capacitance value of the capacitance C1 remains unchanged at 21 pF. Thereby, in the filter circuit 5, the first circuit 11 and the second circuit 21 are coupled, and the cutoff frequency fc is set to 135 kHz.

Then, the transmitting/receiving device 40 switches the reception communication mode to LTE at time t2. At this time, the baseband signal processing LSI 410 outputs the communication mode selection signal Sm specifying LTE. In response thereto, the control unit 408 turns off (opens) the switch elements SW_1 to SW_4 in the I-signal filter circuit 5_A and the Q-signal filter circuit 5_B and changes the capacitance value of the capacitance C1 to 4 pF, by controlling the filter switching signal Sf based on the arrangement in FIG. 9. Thereby, in the filter circuit 5, the second circuit 21 is disconnected, and the cutoff frequency fc is set to 10 MHz.

At the time of receiving the GSM signal, since the switch elements SW_1 to SW_4 are closed, the filter characteristic 100 is influenced by the gain bandwidth of the operational amplifier OP2. However, the same basic circuit configuration of the filter circuit 5 as that of the filter circuit 3 having the capacitance C1 and the resistance R4 reduces the influence, with some reduction in the amount of suppression in a high frequency band (e.g., around 10 MHz in FIG. 10) of a sufficient amount of suppression. Thereby, it is possible to sufficiently suppress adjacent channel interference etc. caused by a 400 kHZ offset and a 600 kHZ offset which are difficult to suppress. On the other hand, to receive the WCDMA signal and the LTE signal with a bandwidth of 20 MHz, a bandwidth more than 10 times the GSM bandwidth is needed. Accordingly, if the switch elements SW_1 to SW_4 in the filter circuit 5 are closed to couple the second circuit 21 and the capacitance value of the capacitance C1 is changed to switch the filter characteristics, the influence of the gain bandwidth of the operational amplifier OP2 becomes more than 10 times, so that the amount of gain suppression is reduced around 10 MHz unless the gain bandwidth of the operational amplifier OP2 is increased. That is, at the time of receiving the WCDMA signal, it might be impossible to sufficiently suppress adjacent channel interference etc. by a 5 MHZ offset and a 10 MHZ offset. The same applies to the reception of the LTE signal with a bandwidth of 20 MHz. Therefore, as in the filter circuit 5, at the time of receiving signals in wideband communication modes such as WCDMA and LTE, the switch elements SW_1 to SW_4 in the filter circuit 5 are opened to disconnect the second circuit 21, and filter characteristics are obtained by the first circuit 11. Thereby, it is possible to obtain the stable filter characteristics without being influenced by the gain bandwidth of the operational amplifier OP2 in the second circuit 21.

Thus, according to the transmitting/receiving device 40 of the fifth embodiment, it is possible to switch the filter characteristics in accordance with the intended reception communication system. Further, since the switch elements SW_1 to SW_4 enable the disconnection of the second circuit 21, it is possible to obtain the optimum filter characteristic for each communication mode without being influenced by the gain bandwidth of the operational amplifier OP2. Further, according to the filter circuit 5, as with the filter circuits 1 to 4, it is possible to implement a filter circuit with a low cutoff frequency, low noise, and low distortion in a smaller area.

While the invention made above by the present inventors has been described specifically based on the illustrated embodiments, the present invention is not limited thereto. It is needless to say that various changes and modifications can be made thereto without departing from the spirit and scope of the invention.

For example, while the current input filter circuits are illustrated as the filter circuits 3 to 5, the same effect can be obtained by inserting the resistances R1_A and R1_B on the input side of the filter circuits 3 to 5.

In the fifth embodiment, the filter circuit 5 is applied to the transmitting/receiving device 40 for switching the three communication systems of GSM, WCDMA, and LTE, but can also be applied to a transmitting/receiving device for switching filter characteristics between other communication systems. For example, the same effect can be obtained by application to a filter circuit that complies with a communication standard of cellular phones of TD-SCDMA (Time Division-Synchronous CDMA), CDMA2000, or the like or a communication standard of communication devices other than cellular phones. Further, in the fifth embodiment, the filter circuit 5 is applied to the filter on the receiving side, but can also be applied to a filter circuit on the transmitting side. Similarly, the filter circuit 5 is applicable not only to the transmitting/receiving device but also to a transmitting device and a receiving device. Furthermore, the filter circuit 5 and the mechanism for controlling the switching of filter characteristics can also be applied to a low-IF transmitting/receiving device. For example, coupling in which the output of the I-signal filter circuit 5_A is fed back to the input of the Q-signal filter circuit 5_B and the output of the Q-signal filter circuit 5_B is fed back to the input of the I-signal filter circuit 5_A can provide the same effect as the transmitting/receiving device 40.

In the transmitting/receiving device 40 according to the fifth embodiment, the control method of closing the switch elements SW_1 to SW_4 at the time of receiving the GSM signal is shown, but the invention is not limited thereto. For example, since LTE is a communication system with appropriately varying reception bandwidths of 1.4 MHz, 3 MHz, 5 MHz, 10 MHz, 15 MHz, 20 MHz, it is also possible to perform control so as to close the switch elements SW_1 to SW_4 at the time of receiving a signal with a relatively small reception bandwidth of 1.4 MHz. Further, it is also possible to configure the circuit so as to vary the capacitance Ch in accordance with the filter switching signal Sf from the control unit 408. For example, it is possible to vary the capacitance Ch to vary the cutoff frequency in addition to performing control so as to close the switch elements SW_1 to SW_4 at the time of receiving the 1.4 MHz LTE signal. Further, at this time, the capacitance C1 may be varied together. Furthermore, the capacitances C1, Ch may be adjusted to correct process variations in filter characteristics in accordance with the filter switching signal Sf from the control unit 408.

The insertion positions of the switch elements SW_1 to SW_4 are not limited to those shown in FIG. 8, but may be other positions that enable the first circuit 11 not to be influenced by the second circuit 21 when the switch elements SW_1 to SW_4 are opened. For example, the switch element SW_1 may be disposed between the resistance R3_A and the inverting output terminal Vop2m of the operational amplifier OP2.

In the case where a communication system that does not require the filter and a communication system that requires the filter are mixed in the transmitting/receiving device 40, the first circuit 10 can be applied in place of the first circuit 11. In this case, the switch elements SW_1 to SW_4 are opened in the communication system that does not require the filter, and the switch elements SW_1 to SW_4 are closed in the communication system that requires the filter. That is, the switch elements SW_1 to SW_4 are switched at the time of changing the communication system or the reception bandwidth in accordance with the necessity of change in filter characteristics.

The transmitting/receiving device 40 shown in FIG. 7 is merely one example. For example, in case of need for fifth or sixth order filter characteristics, additional filter circuits can be provided subsequent to the I-signal filter circuit 5_A and the Q-signal filter circuit 5_B.

What is claimed is:

1. A filter circuit comprising:
   a first circuit which receives a signal supplied to an input terminal, amplifies an input signal, and outputs an amplified signal to an output terminal; and
   a second circuit which receives the signal output to the output terminal and is feedback-coupled to the input of the first circuit,
   wherein the second circuit includes:
   a first capacitance element;
   a first differential amplification circuit for receiving the signal output to the output terminal through the first capacitance element;
   a first resistance element for forming a negative feedback path between the input and output of the first differential amplification circuit; and
   a second resistance element for forming a negative feedback path between the output of the first differential amplification circuit and the input of the first circuit.

2. The filter circuit according to claim 1,
   wherein the first circuit includes a second differential amplification circuit for receiving the signal supplied to the input terminal and a signal fed back through the second resistance element and a third resistance element for forming a negative feedback path between the input and output of the second differential amplification circuit.

3. The filter circuit according to claim 2, wherein the first differential amplification circuit and the second differential amplification circuit include a MOS transistor.

4. The filter circuit according to claim 2, wherein in the second resistance element and the third resistance element, a ratio of a resistance value of the third resistance element to a resistance value of the second resistance element is equal to or greater than a ratio of a maximum output voltage of the second differential amplification circuit to a maximum output voltage of the first differential amplification circuit.

5. The filter circuit according to claim 2, wherein the first resistance element has a resistance value larger than a resistance value of the third resistance element.

6. The filter circuit according to claim 2, wherein the first circuit further includes a second capacitance element placed in parallel to the third resistance element.

7. The filter circuit according to claim 6, wherein the second circuit further includes a fourth resistance element placed in series to a series path of the input of the first differential amplification circuit and the first capacitance element.

8. The filter circuit according to claim 7, wherein the second circuit further includes a third capacitance element placed in parallel to the first resistance element.

9. The filter circuit according to claim 2, wherein the first circuit further includes a fifth resistance element, wherein the second differential amplification circuit receives the signal supplied to the input terminal through the fifth resistance element.

10. The filter circuit according to claim 6, further comprising a switch element for switching connection and disconnection between the first circuit and the second circuit, wherein the second capacitance element has a variable capacitance value.

11. A receiving device comprising:
an antenna unit for receiving a signal;
a conversion unit for converting the signal received by the antenna unit into a baseband signal;
a filter circuit for acquiring a signal in a frequency band corresponding to an intended communication system from the baseband signal converted by the conversion unit; and
a control unit for performing control for switching filter characteristics of the filter circuit,
wherein the filter circuit comprises:
a first circuit which receives the baseband signal; amplifies an input signal, and outputs an amplified signal;
a second circuit which receives an output signal of the first circuit and is feedback-coupled to the input of the first circuit; and
a switch element for switching connection and disconnection between the first circuit and the second circuit,
wherein the second circuit includes:
a first capacitance element;
a first differential amplification circuit for receiving the output signal of the first circuit through the first capacitance element;
a first resistance element for forming a negative feedback path between the input and output of the first differential amplification circuit; and
a second resistance element for forming a negative feedback path between the output of the first differential amplification circuit and the input of the first circuit,
wherein the first circuit includes:
a second differential amplification circuit for receiving the baseband signal and a signal fed back through the second resistance element;
a third resistance element for forming a negative feedback path between the input and output of the second differential amplification circuit; and
a second capacitance element placed in parallel to the third resistance element,
wherein the second capacitance element has a variable capacitance value, and
wherein the control unit controls the switch element and the capacitance value of the second capacitance element in accordance with the intended communication system.

12. The receiving device according to claim 11, wherein if the intended communication system is a first communication mode, the control unit couples the first circuit and the second circuit by the switch element, and sets the capacitance value of the second capacitance element to a first capacitance value,
wherein if the intended communication system is a second communication mode having a higher frequency band than the first communication mode, the control unit disconnects the first circuit from the second circuit by the switch element, and sets the capacitance value of the second capacitance element to the first capacitance value,
wherein if the intended communication system is a third communication mode having a higher frequency band than the second communication mode, the control unit disconnects the first circuit from the second circuit by the switch element, and sets the capacitance value of the second capacitance element to a second capacitance value smaller than the first capacitance value.

13. The receiving device according to claim 11, wherein the first differential amplification circuit and the second differential amplification circuit include a MOS transistor.

14. The receiving device according to claim 11, wherein in the second resistance element and the third resistance element, a ratio of a resistance value of the third resistance element to a resistance value of the second resistance element is equal to or greater than a ratio of a maximum output voltage of the second differential amplification circuit to a maximum output voltage of the first differential amplification circuit.

15. The receiving device according to claim 11, wherein the first resistance element has a resistance value larger than a resistance value of the third resistance element.

16. The receiving device according to claim 11, wherein the second circuit further includes a fourth resistance element placed in series to a series path of the input of the first differential amplification circuit and the first capacitance element.

17. The receiving device according to claim 16,
wherein the second circuit further comprises a third capacitance element placed in parallel to the first resistance element.

18. The receiving device according to claim 11,
wherein the first circuit further has a fifth resistance element, and
wherein the second differential amplification circuit receives the baseband signal through the fifth resistance element.

19. The filter circuit according to claim 2, wherein the third resistance element forms the negative feedback path between the input and the output of the second differential amplification circuit bypassing the second resistance element.

20. The filter circuit according to claim 1, wherein the second resistance element connects an inverted output of the first differential amplification circuit to a non-inverted input of the first circuit or connects a non-inverted output of the second differential amplification circuit to an inverted input of the first circuit.

* * * * *